United States Patent
Aylward (10) Patent No.: US 10,790,831 B2
(45) Date of Patent: Sep. 29, 2020

(54) TEMPERATURE COMPENSATED CRYSTAL OSCILLATOR

(71) Applicant: Rakon Limited, Auckland (NZ)

(72) Inventor: Kevin Alan Neil Aylward, Stevenage (GB)

(73) Assignee: RAKON LIMITED, Auckland (NZ)

( * ) Notice: Subject to any disclaimer, the term of this patent is extended or adjusted under 35 U.S.C. 154(b) by 0 days.

(21) Appl. No.: 15/903,178

(22) Filed: Feb. 23, 2018

(65) Prior Publication Data

US 2018/0241401 A1 Aug. 23, 2018

(30) Foreign Application Priority Data

Feb. 23, 2017 (NZ) ........................... 729453

(51) Int. Cl.
| | | |
|---|---|---|
| H03B 5/04 | (2006.01) | |
| H03B 5/32 | (2006.01) | |
| H03L 1/02 | (2006.01) | |
| H03L 1/04 | (2006.01) | |
| H03L 7/099 | (2006.01) | |

(52) U.S. Cl.
CPC .............. *H03L 1/028* (2013.01); *H03B 5/04* (2013.01); *H03B 5/32* (2013.01); *H03L 1/022* (2013.01); *H03L 1/027* (2013.01); *H03L 1/04* (2013.01); *H03L 7/099* (2013.01)

(58) Field of Classification Search
CPC ... H03B 5/04; H03B 5/30; H03B 5/32; H03B 5/36; H03B 5/362; H03B 5/364; H03B 5/366; H03B 5/368; H03H 3/013; H03J 3/04; H03L 1/02; H03L 1/022; H03L 1/023; H03L 1/025; H03L 1/026; H03L 1/027; H03L 1/028; H03L 1/04
USPC .................................. 331/66, 154, 158, 176
See application file for complete search history.

(56) References Cited

U.S. PATENT DOCUMENTS

| | | | |
|---|---|---|---|
| 6,002,291 A | * 12/1999 | Gilbert | G06G 7/20 327/129 |
| 6,172,574 B1 | * 1/2001 | Sirito-Olivier | H03B 5/366 331/116 R |
| 6,603,364 B2 | 8/2003 | Nemoto | |
| 2005/0128018 A1 | * 6/2005 | Meltzer | H03L 1/022 331/176 |
| 2013/0321048 A1 | * 12/2013 | He | G01S 19/235 327/156 |
| 2014/0337261 A1 | * 11/2014 | Esterline | G06N 3/02 706/25 |

FOREIGN PATENT DOCUMENTS

| | | | | |
|---|---|---|---|---|
| WO | WO2015/193539 | * | 12/2015 | H03B 5/368 |

* cited by examiner

*Primary Examiner* — Levi Gannon
(74) *Attorney, Agent, or Firm* — Dann, Dorfman, Herrell and Skillman, P.C.

(57) ABSTRACT

A temperature compensated crystal oscillator implements temperature compensation by generating and applying a temperature compensation signal via a function having a plateau region and a higher slope region, where a horizontal position of the higher slope region, a slope value in the higher slope region, and a function value change magnitude over the higher slope region are adjustable.

23 Claims, 6 Drawing Sheets

TEMPERATURE COMPENSATED CRYSTAL OSCILLATOR

FIELD OF THE INVENTION

The present invention relates to Temperature Compensated Crystal Oscillators (TCXOs) wherein the residual frequency instability is reduced by applying an additional temperature compensation signal, generated as a single, or a combination of two or more, suitable non-linear functions of a signal carrying temperature information.

BACKGROUND OF THE INVENTION

In many contemporary TCXOs, temperature compensation is achieved by generating a temperature-dependent compensating voltage and applying it to a Voltage Controlled Crystal Oscillator (VCXO). In order to not introduce abrupt frequency changes or digital noise, most of commercially available analog TCXOs are designed so that only analog circuitry is active during normal operation of the TCXO device following its start-up.

Figure 1:
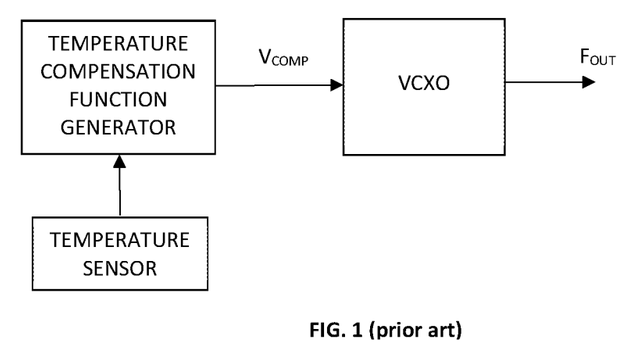
FIG. 1 shows the structure of an analog TCXO (prior art).

The structure of such devices is shown in FIG. 1 (prior art). In this diagram, the VCXO is a tunable circuit arranged to produce an output signal of required frequency $F_{OUT}$. The resonant frequency of the crystal resonator deployed as part of the VCXO circuit is temperature-dependent. In order to improve the frequency $F_{OUT}$ versus temperature stability, a Temperature Compensation Function Generator circuit is arranged to produce temperature compensating voltage $V_{COMP}$, and the latter is applied to the VCXO to correct the output frequency. The compensating voltage is produced as a function of the temperature sensor output signal, and the function is tailored so that, in conjunction with the VCXO's frequency versus temperature characteristic, the application of the $V_{COMP}$ voltage reduces the output frequency $F_{OUT}$ instability.

The frequency versus temperature characteristic of the VCXO is usually approximated as a polynomial function, and the compensating voltage $V_{COMP}$ is generated by the Temperature Compensation Function Generator as a polynomial function to suit the characteristic of the VCXO.

Figure 2:
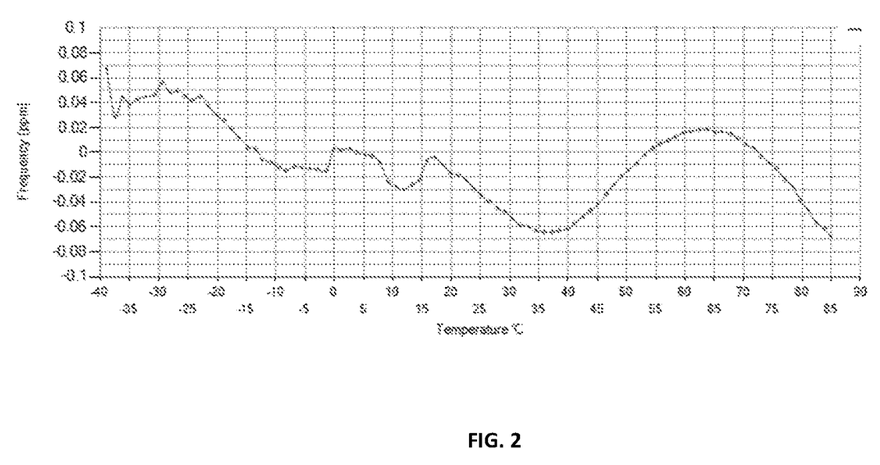
FIG. 2 and FIG. 2*a* show examples of two real-life TCXOs' residual temperature compensation error curves.
Figure 2A:
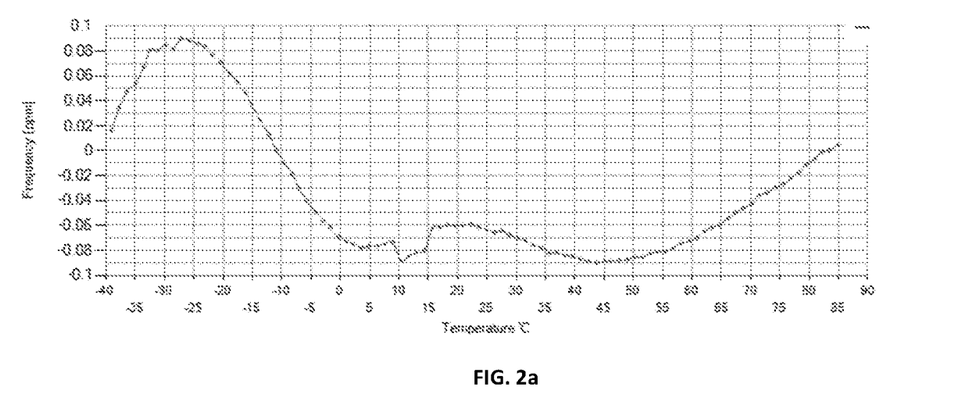

The residual frequency versus temperature error curve of an analog TCXO cannot be easily defined by a simple mathematical expression such as a polynomial function. Moreover, the shape of the error curve is different for every TCXO sample; in particular, the position, magnitude, shape, and number of non-linearities in the frequency error curve with respect to temperature are unique for every TCXO device. These non-linearities are a result of interaction between the crystal resonator characteristic non-linearities and oscillator component characteristic non-linearities. Shown in FIG. 2 and FIG. 2a are examples of two real-life TCXO frequency versus temperature error curves.

The seemingly random, inconsistent shape of TCXOs' frequency versus temperature residual error curves does not lend itself to further error reduction using presently known analog compensation techniques, such as techniques utilizing polynomial function generators. This limits the presently achievable analog TCXO frequency stability errors to anywhere from about ±0.1 parts per million (PPM) or higher.

Attempts have been known to further reduce the frequency versus temperature stability error by adding a digitally generated post-compensation voltage. For example, U.S. Pat. No. 6,603,364 describes a device wherein temperature compensation voltages generated by both an analog compensation section and a digital compensation section are applied to the crystal oscillator in order to achieve higher frequency stability than that of an analog TCXO.

Another known approach is piecewise residual frequency error reduction, whereby the residual frequency versus temperature curve is divided into two or more segments, and each segment is approximated by its own analog function generator that operates over the temperature range relating to that segment. This approach is often not practicable in terms of its hardware implementation, and frequency jumps at the segment boundaries are difficult to eliminate.

The present invention offers a useful way of reducing the temperature compensation frequency errors, whereby an additional temperature compensation signal ("secondary compensation" signal, or "post-compensation" signal) is generated as either a single, or a combination of two or more, signals generated as suitable non-linear functions that are active over the intended compensation temperature range.

SUMMARY OF THE INVENTION

In broad terms, the invention provides a practicable temperature compensation technique that makes it possible to further reduce frequency instability in Temperature Compensated Crystal Oscillators (TCXOs).

In broad terms, in accordance with the present invention a temperature compensation signal is generated as either a single, or as a combination of two or more, signals generated as suitable non-linear functions operating over the intended compensation temperature range, and the thus formed temperature compensation signal is applied to the VCXO circuit to further improve the TCXO's frequency stability.

The suitable non-linear functions used to generate the temperature compensation signal can be any one or more functions that satisfy the following requirements:
- the function has a region approximating a plateau, and a substantially higher slope region; and
- the said two regions are connecting continuously (i.e., without discontinuities) and smoothly; and
- the horizontal position of the substantially higher slope region, the slope value in the substantially higher slope region, and the function value change magnitude over the substantially higher slope region are adjustable.

The last requirement allows to shape the post-compensation signal to match the targeted TCXO's residual frequency error curve shape as closely as possible.

At least in some embodiments, "a region approximating a plateau" or "a plateau region" means a region of the function curve that exhibits a linear asymptotic approach to a zero slope (horizontal) line. The "substantially higher slope region" is a region of the function curve having a slope that is substantially higher than the slope in the plateau region.

A number of mathematical functions satisfying the above-mentioned requirements can be used to implement the temperature compensation function generators in the devices of the invention. For example, sigmoid functions are suitable for implementing the post-compensation technique, as sigmoid functions satisfy the aforementioned requirements. In particular, since a sigmoid function is bounded by a pair of horizontal asymptotes and first derivative (i.e., slope) of a sigmoid function is bell shaped, a sigmoid function has two regions approximating plateaux and a region where the function slope value is substantially higher than that in the plateauing regions.

The choice of specific function depends on how practicable it is to generate it in electronics hardware of the kind used in a given device.

The magnitude, slope, and position of the said single, or a number of, generated function signals are adjusted for every TCXO device so that the post-compensation signal, formed as a combination of the generated functions, is optimized for the shape of the particular TCXO's residual frequency versus temperature error curve.

It may be best if the functions chosen to be used for generating the one or more signals to form the temperature compensation signal are such that the horizontal position of the substantially higher slope region, the slope value in the substantially higher slope region, and the function value change magnitude over the substantially higher slope region are adjustable independently from each other, although functions with interactions between these parameters can be also deployed, as the interactions can be accounted for when optimal parameter values are being determined.

The shape of the temperature compensation signal, formed according to the invention to improve the stability of a given TCXO device depends on the shape of the residual frequency error curve of the device. Since every TCXO sample's residual error curve shape is different and unique, the slope of the function signals generated according to the invention, the functions' horizontal position, and their magnitude are adjustable.

The required slope adjustment range depends on the range of residual frequency error curve slopes exhibited by a given population of TCXO devices. In at least some embodiments, a function slope adjustment range from about 0.2 PPB/° C. to about 50 PPB/° C. is sufficient; in other embodiments, a wider slope adjustment range from about 1 PPB/° C. to about 200 PPB/° C. is required; in yet other embodiments, an even wider slope adjustment range from about 4 PPB/° C. to about 1,000 PPB/° C. is required. A function slope adjustment range different than those mentioned above may be required to form the compensation signal to suit the extent of residual error curve variability within a given TCXO population.

The horizontal position of the generated functions is adjustable to cover the compensation temperature range of a given TCXO population. In some embodiments, the horizontal position of the generated functions is arranged to be adjustable within the temperature range from −40° C. to +85° C.; in other embodiments, a wider horizontal position adjustment range from −55° C. to +105° C. is required; in yet other embodiments, an even wider horizontal position adjustment range from −55° C. to +125° C. is required. A horizontal position adjustment range different than those mentioned above may be required to suit the compensation temperature range specified for a given TCXO population.

The magnitude of the generated functions is adjustable to cover the possible magnitude range of TCXOs' residual frequency error. Contemporary TCXOs exhibit residual frequency instability ranging from ±100 PPB maximum, to about ±2.5 PPM maximum over the intended compensation temperature range. In at least some embodiments, it is sufficient that the magnitude of function signals generated according to the present invention is adjustable within a range of about ±100 PPB; in other embodiments, the required function magnitude adjustment range is wider and extends to ±0.5 PPM; in yet other embodiments, an even wider range of ±2.5 PPM is required. A function magnitude adjustment range different than those mentioned above may be required to compensate the residual frequency errors of a given TCXO population.

Without sacrificing the generality of the concept of the present invention, the invention is illustrated further herein through the use of a Hyperbolic Tangent (Tanh) function, which is one of the functions in the sigmoid function set. This function is particularly suitable for devices implemented as a bipolar semiconductor integrated circuit (IC).

Without deviating from the concept of the present invention, a person skilled in the art may select different functions to implement the devices of the invention; for example, for devices implemented in a different semiconductor process, an Arctangent (arctan) function, also belonging to the sigmoid set of functions, may be more suitable. No matter which specific function is chosen, it must satisfy the requirements listed above.

In broad terms in another aspect the invention comprises a method of manufacturing temperature compensated crystal oscillators which each comprise an electronic circuit arranged to generate a temperature compensation signal comprising at least one signal generated as a function of a signal carrying temperature information, which comprises the steps of,— characterizing each oscillator's residual frequency versus temperature error;

causing said at least one signal to comprise a plateau region, and a continuously and smoothly connected substantially higher slope region; and for each oscillator individually adjusting a horizontal position of the substantially higher slope region, a slope value in the substantially higher slope region, and a function value change magnitude over the substantially higher slope region, to optimise said temperature compensation signal for the individual oscillator.

In broad terms in a further aspect the invention comprises a temperature compensated crystal oscillator, comprising an electronic circuit arranged to generate a temperature compensation signal comprising at least one signal generated as a functions of a signal carrying temperature information, which function comprises a plateau region and a continuously and smoothly connected substantially higher slope region, and wherein any one or more of a horizontal position of the substantially higher slope region, a slope value in the substantially higher slope region, and a function value change magnitude over the substantially higher slope region are adjustable.

The term "comprising" as used in this specification and claims means "consisting at least in part of". When interpreting each statement in this specification and claims that includes the term "comprising", features other than that or those prefaced by the term may also be present. Related terms such as "comprise" and "comprises" are to be interpreted in the same manner.

In at least some embodiments any one or more of the aforementioned adjustments of a horizontal position of the substantially higher slope region, of a slope value in the substantially higher slope region, and of a function value change magnitude over the substantially higher slope region, can be effected indirectly and as a consequence of adjusting other function parameters. For example, adjusting the horizontal position of a region where the substantially higher slope region and the plateau region are connecting will have the effect of effectively adjusting the horizontal position of the substantially higher slope region. Similarly, and as another example, adjusting the relative horizontal positions of, or spacing between, regions where the substantially higher slope region is connecting to each of the two plateau regions in a sigmoid function will have the effect of effectively adjusting the slope of the higher slope region. As yet another example, adjusting the magnitude of the function change over another region may have the consequential effect of adjusting the function value change magnitude over the substantially higher slope region. In other words, any one or more of the function adjustments of a horizontal position of the substantially higher slope region, of a slope value in the substantially higher slope region, and of a function value change magnitude over the substantially higher slope region can be implemented as either direct, or indirect adjustments of these function parameters. In this specification and claims references to adjusting or adjustment of the horizontal position of the substantially higher slope region, slope value in the substantially higher slope region, and function value change magnitude over the substantially higher slope region, should be understood accordingly.

BRIEF DESCRIPTION OF THE FIGURES

The invention is further described with reference to the accompanying figures, in which.

DETAILED DESCRIPTION OF EMBODIMENTS

In order to further reduce TCXOs' frequency versus temperature stability errors, additional ("post-compensation") signals are generated and applied to the VCXO (the latter comprises part of a TCXO, as shown in FIG. 1 (prior art)). Depending on the shape of a given TCXO's residual frequency error curve, the post-compensation signal is generated as one, or a combination of multiple, signals, each such signal formed as a function satisfying the aforementioned requirements, such as, for example, the hyperbolic tangent Tanh function.

Figure 3:
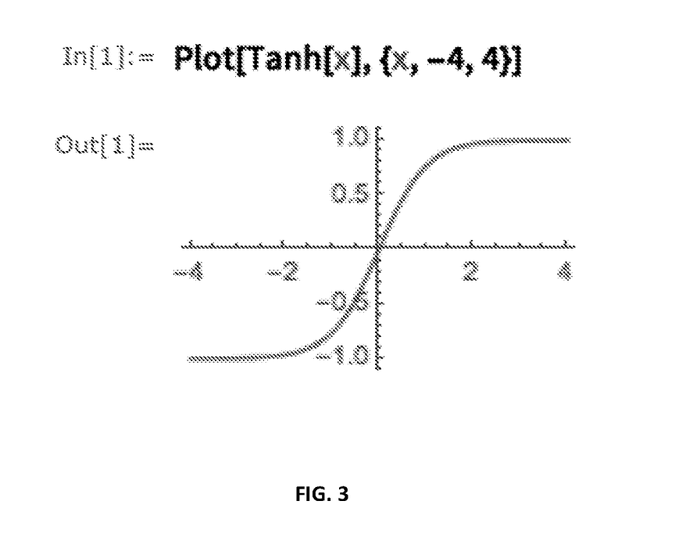
FIG. 3 shows a plot of a Hyperbolic Tangent (Tanh) function.

Advantageously, the hyperbolic tangent function Tanh generates a smooth, rounded and bounded analog curve which can be used effectively when reducing TCXOs' residual frequency errors. An example plot of a Tanh function is shown in FIG. 3.

Another advantage of the Tanh function is that Tanh function signals can be readily generated using bipolar electronic circuits, as a bipolar differential transistor pair has a Tanh response.

The Tanh function can be mathematically expressed in a number of different ways. The following equation lends itself to convenient manipulation:

$$y = \frac{e^{2x} - 1}{e^{2x} + 1}$$

By adding adjustable coefficients to the above equation, the magnitude (vertical gain), slope, and horizontal position (inflection point) of the Tanh curve can be adjusted:

$$y = a\frac{e^{2b(x-c)} - 1}{e^{2b(x-c)} + 1}$$

Figure 4:
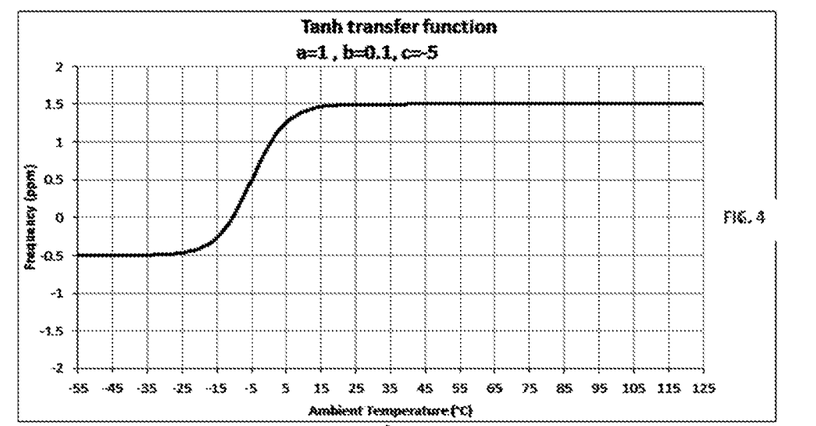
FIGS. 4, 4*a*, and 4*b* present an example of two signals generated as Tanh functions of temperature (FIGS. 4 and 4*a*), and the result of combining the two functions to form a temperature compensation signal suitable to correct residual compensation errors in a TCXO (FIG. 4*b*).
Figure 4A:
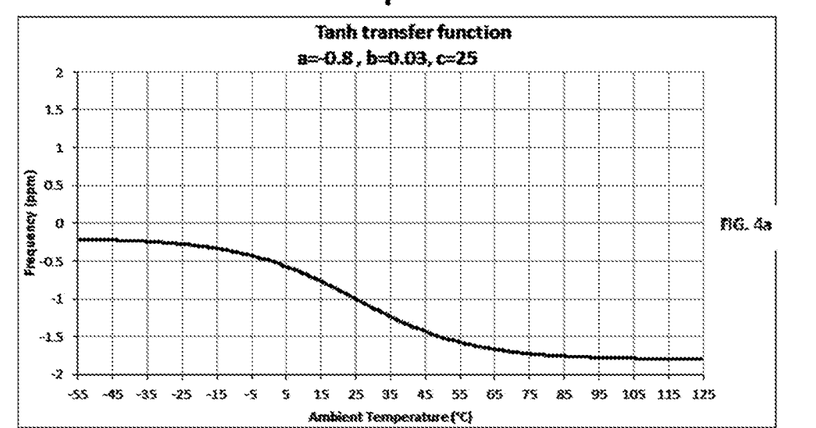
Figure 4B:
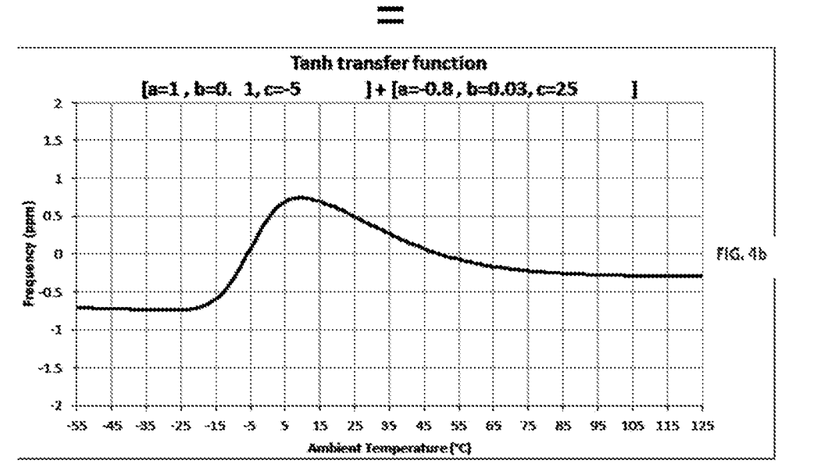

Furthermore, by generating and combining multiple Tanh curves it is possible to form a highly variable smooth curve that closely matches a given TCXO's residual frequency error curve. Plots shown in FIGS. 4, 4*a* and 4*b* present an example of two signals generated as Tanh functions of temperature (FIGS. 4 and 4*a*), and the result of combining these two functions to form a temperature compensation signal suitable to correct residual compensation errors in a TCXO (FIG. 4*b*). The two Tanh signals are generated using different sets of "a", "b", and "c" coefficients, where "a" is the vertical gain, "b" is the slope, and "c" is the inflection. The first of the three plots shows the first Tanh function, formed with a=1, b=0.1, and c=−5. The second plot shows the second Tanh function, formed with a=−0.8, b=0.03, and c=25. The third plot shows the combination (sum) of the two Tanh functions.

By generating one or more Tanh signals (voltages or currents) and combining them, one can form a temperature compensation signal that is suitable to further reduce a TCXO's residual frequency versus temperature errors.

Figure 5:
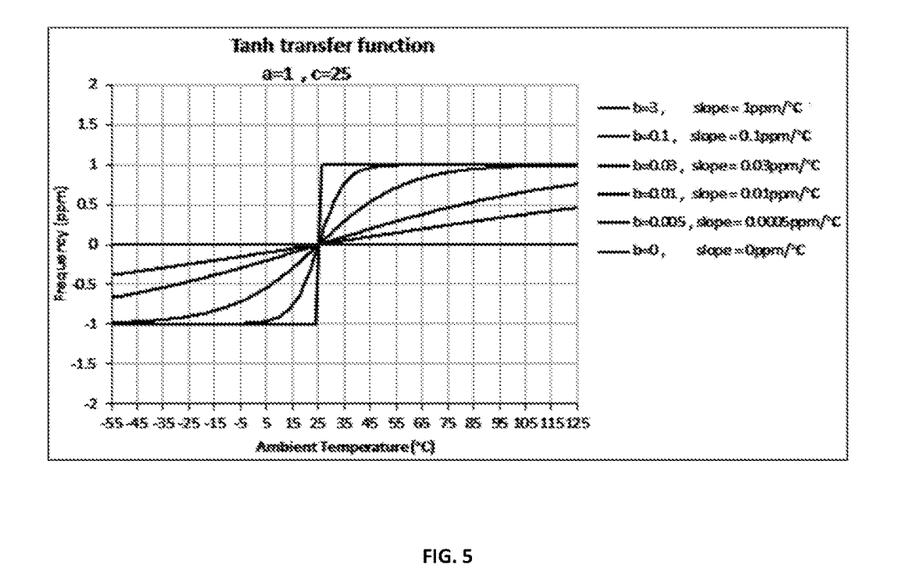
FIG. 5 illustrates slope adjustment in a generated Tanh function.

For each of the Tanh functions generated, the magnitude (i.e., the function value change magnitude over the substantially higher slope region) is set by adjusting the value of coefficient "a", the slope is set by adjusting the value of coefficient "b", and the horizontal position is set by adjusting the value of coefficient "c". The plot in FIG. 5 illustrates how the slope of a Tanh function can be adjusted within a range from 0(ppm/° C.) when the coefficient "b" is set to zero, to (1 ppm/° C.) when b=3.

Figure 6:
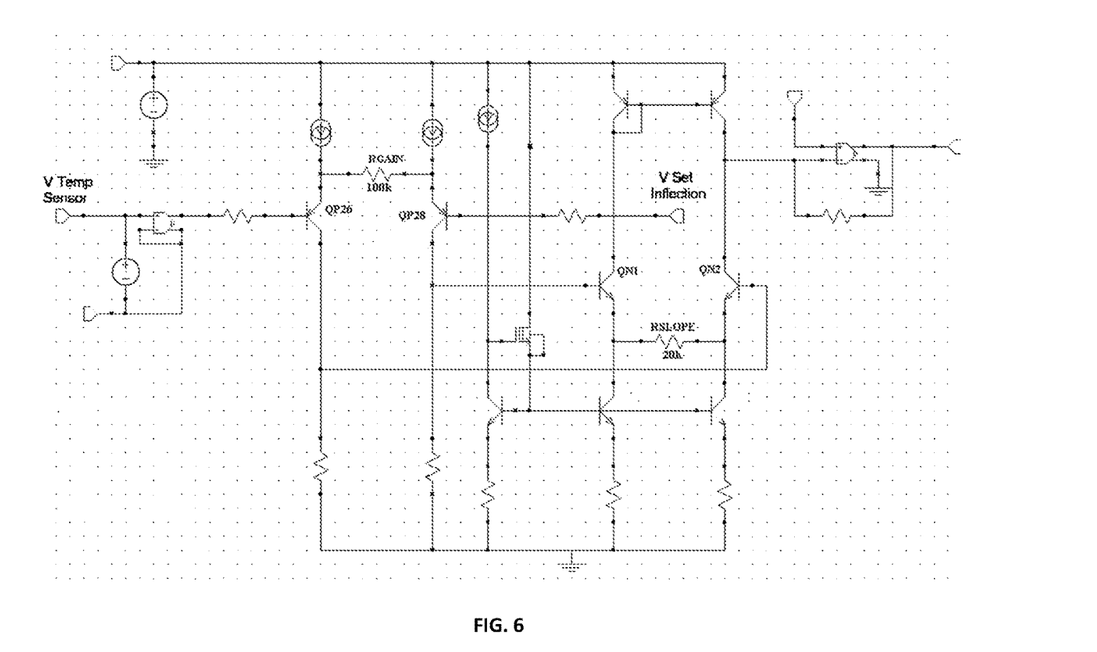
FIG. 6 shows an example of an electronic circuit that generates a Tanh voltage.

An example of an electronic circuit that generates a Tanh voltage is shown in FIG. 6. In this circuit, a signal carrying temperature information (temperature sensor output voltage "V Temp Sensor") is used as one of the input voltages and the Tanh function argument. The value of the "RGAIN" resistor connected between emitters of transistors QP26 and QP28 determines the magnitude of the generated Tanh function (corresponds to coefficient "a" in the equation above); the value of the resistor "RSLOPE" connected between emitters of transistors QN1 and QN2 determines the slope of the generated Tanh function (corresponds to coefficient "b" in the equation above); another circuit input at terminal "V Set Inflection" accepts a voltage that determines the horizontal position of the generated Tanh function curve (corresponds to coefficient "c" in the equation above).

Figure 7:
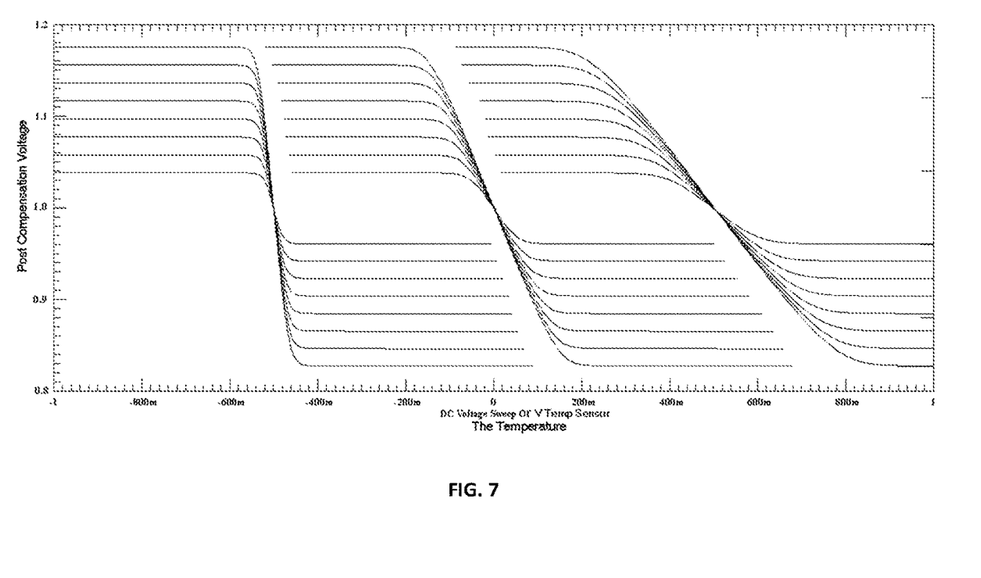
FIG. 7 illustrates how the horizontal position, slope and magnitude of the Tanh function generated by the circuit shown in FIG. 6 change when the "V Set Inflection" voltage, "RSLOPE" resistor value and "RGAIN" resistor values are changed.

The graph shown in FIG. 7 illustrates how the horizontal position, slope and magnitude of the Tanh function generated by the circuit shown in FIG. 6 change when the "V Set Inflection" voltage, "RSLOPE" resistor value and "RGAIN" resistor values are changed.

While FIG. 6 shows an implementation example of a circuit generating a hyperbolic tangent Tanh voltage, the Tanh function generating circuitry is not limited to the example shown in FIG. 6, and a person skilled in the art of electronic circuit design will be able to come up with alternative circuits to generate a Tanh function signal.

Several instances of the circuit shown in FIG. 6, or of an alternative circuit generating a suitably chosen function signal, are likely to be used in a typical embodiment of this invention, to generate and combine a number of signals as functions of a signal carrying temperature information and thus form a post-compensation signal to reduce the residual TCXO error. Such post-compensation technique allows to reduce the residual frequency versus temperature instability from ±100 parts per billion (PPB) or higher (current state of the art) to around ±5PPB.

It will be appreciated by persons skilled in the art that the number of function signals generated to form a post-compensation signal according to the present invention depends on the shape of a given TCXO's residual frequency versus temperature error. In at least some embodiments of the invention, several (two or more) function signals will be generated. While there are a number of functions satisfying the aforementioned requirements, in at least some embodiments several signals of the same function type will be generated, with the choice of specific function type defined largely by the practicalities of generating the function in the electronics hardware deployed.

The temperature compensation technique of the present invention has a number of advantages over digital post-compensation or over piecewise analog post-compensation, such as,—

All function generating circuits deployed in a TCXO device of the invention are active across the intended compensation temperature range, thus causing no discontinuities in the frequency versus temperature post-compensation error curve.

The operation of the TCXO device of the invention can be purely analog, i.e. no digital activity takes place during normal operation of the device and no digital noise due to clocking or digital signal transitions is generated.

The individual function curves can be adjusted in order to form a compensation signal to fit any or almost any TCXO residual error curve.

The temperature compensation technique can be implemented as part of a complete TCXO integrated circuit (IC), or as a stand-alone auxiliary IC that allows to use the temperature compensation technique to improve the frequency stability of prior art TCXOs, such as, for example, the TCXO shown in FIG. 1 (prior art).

Figure 8:
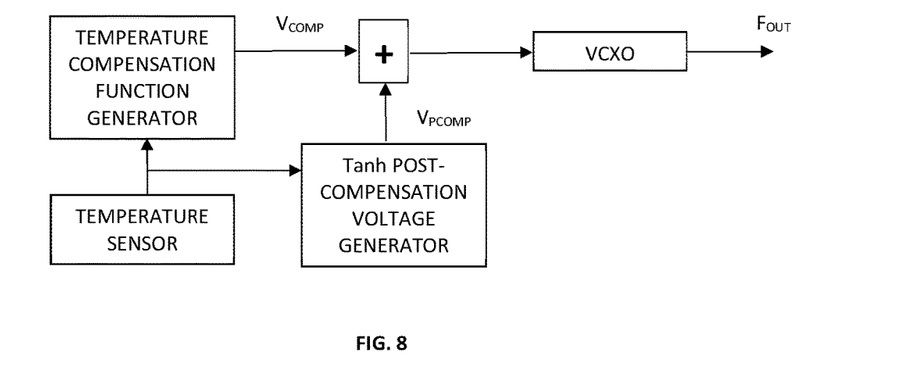
FIG. 8 shows an example structure of a TCXO IC deploying the temperature compensation technique of the invention.

A structure example of a complete TCXO IC deploying the compensation technique of the present invention is shown in FIG. 8. In this example, the $V_{COMP}$ voltage generated by the Temperature Compensation Function Generator (as in FIG. 1 (prior art)) is added to a post-compensation voltage $V_{PCOMP}$ generated by the Post-Compensation Voltage Generator as per the present invention, and the sum of the voltages $V_{COMP}$ and $V_{PCOMP}$ is applied to compensate the VCXO and thus achieve higher stability of frequency $F_{OUT}$. The Tanh Post-Compensation Voltage Generator produces the additional compensation signal $V_{PCOMP}$ as either a single, or as a combination of two or more, signals generated as Tanh functions of the Temperature Sensor's output signal; as pointed out before, other suitable functions can be used, depending on the semiconductor process technology used to implement the device, as long as the selected functions satisfy the following requirements:

the function has a region approximating a plateau, and a substantially higher slope region; and the said two regions are connecting continuously (i.e., without discontinuities) and smoothly; and the horizontal position of the substantially higher slope region, the slope value in the substantially higher slope region, and the function value change magnitude over the substantially higher slope region are adjustable.

It is best if the functions chosen to be used for generating the one or more signals to form the temperature compensation signal are such that the horizontal position of the substantially higher slope region, the slope value in the substantially higher slope region, and the function value change magnitude over the substantially higher slope region are adjustable independently from each other, although functions with interactions between these parameters can be also deployed, as the interactions can be accounted for when optimal parameter values are being determined.

Although the invention is illustrated herein by showing how it can be used to effect additional temperature compensation ("post-compensation") in TCXO devices where primary temperature compensation is done by other techniques (such as, for example, a polynomial function), the present invention can be used, without deviating from its concept, to form the primary temperature compensation signal too, if the frequency versus temperature characteristic of the uncompensated oscillator lends itself to a close enough approximation by either a single, or by a combination of several, Tanh functions, or any other functions satisfying the aforementioned requirements.

Without deviating from the concept of the present invention, the signals generated as Tanh functions, or as any other functions satisfying the aforementioned requirements, can be generated either by analog circuits (such as, for example, the circuit shown in FIG. 6), or by digital circuits (such as a microcontroller). In either case, the signals are generated as functions of a signal carrying temperature information, which can be an analog signal (produced, for example, by an analog temperature sensor), or a digital signal (produced, for example, as a result of digitizing the output signal of a temperature sensor).

In the embodiments described above all of the horizontal position of the higher slope region, slope value in the higher slope region, and the function value change magnitude over the higher slope region are adjustable. However, in other embodiments any one only or two only of the horizontal position of the higher slope region, slope value in the higher slope region, and function value change magnitude over the higher slope region may be adjustable. For example, it may be sufficient in some applications for only the horizontal position and function value change magnitude to be adjustable.

Figure 9:
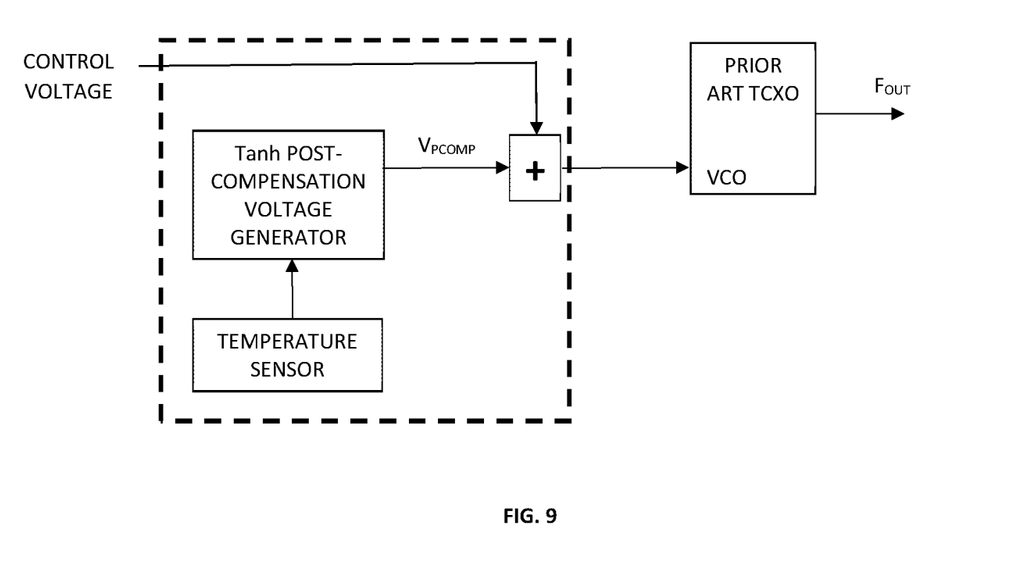
FIG. 9 shows an example structure of a stand-alone auxiliary IC used to post-compensate a conventional (prior art) TCXO.

As an alternative embodiment of the invention, a stand-alone auxiliary IC can be implemented and used to post-compensate prior art TCXOs. The structure of such an auxiliary IC is shown in FIG. 9. In the auxiliary IC (encompassed by the dashed line in FIG. 9), the "CONTROL VOLTAGE" that is usually applied to the "VCO" input of the "PRIOR ART TCXO", is combined with the post-compensation voltage $V_{PCOMP}$ generated as per the techniques of the present invention, for example as a single, or a combination of a two or more, Tanh function voltages. The output of the summing block is the new control signal that is now applied to the "VCO" input of the "PRIOR ART TCXO" to post-compensate the "PRIOR ART TCXO".

The high frequency stability of TCXO devices implemented using the techniques of the present invention will benefit the performance of any electronic apparatus where stable reference frequency versus temperature characteristics are required. Such apparatus include, but are not limited to, portable and stationary telecommunication equipment, high speed networking equipment, radio communication equipment, and navigation equipment.

The invention claimed is:

1. A temperature compensated crystal oscillator, comprising:
   a crystal oscillator,
   a primary temperature compensation signal generator arranged to produce a primary temperature compensation signal which effects a primary temperature compensation action over an entire temperature compensation temperature range of the temperature compensated crystal oscillator which action is complementary, over said entire temperature compensation temperature range, to a frequency versus temperature characteristic of the crystal oscillator, to reduce a frequency versus temperature error of the crystal oscillator, leaving a residual frequency versus temperature error, and
   a secondary temperature compensation signal generator arranged to produce a secondary temperature compensation signal which effects a secondary temperature compensation action within said temperature compensation temperature range, which action is complementary to said residual frequency versus temperature error, to reduce said residual frequency versus temperature error,
   wherein the temperature compensated crystal oscillator can be arranged to operate only under the primary temperature compensation action to facilitate characterisation of said residual frequency versus temperature error, and
   wherein the secondary temperature compensation signal generator comprises an analog circuit arranged to generate at least one analog temperature compensation signal as a function of an analog temperature sensor output signal, the said function comprising a plateau region, and a continuously and smoothly connected substantially higher slope region.

2. A temperature compensated crystal oscillator according to claim 1, wherein the secondary temperature compensation signal comprises a combination of two or more analog signals generated by analog circuits as functions of an analog temperature sensor output signal at least one of said functions region, and a continuously and smoothly connected substantially higher slope region.

3. A temperature compensated crystal oscillator according to claim 2, wherein two or more of said functions comprise a plateau region, and a continuously and smoothly connected substantially higher slope region.

4. A temperature compensated crystal oscillator according to claim 3, wherein two or more of said functions comprise a sigmoid function.

5. A temperature compensated crystal oscillator according to claim 2, wherein a horizontal position of the substantially higher slope region of said at least one of said functions, a slope value in the substantially higher slope region of said at least one of said functions, or a function value change magnitude over the substantially higher slope region of said at least one of said functions, is adjustable.

6. A temperature compensated crystal oscillator according to claim 2, wherein a horizontal position of the substantially higher slope region of said at least one of said functions, a slope value in the substantially higher slope region of said at least one of said functions, and a function value change magnitude over the substantially higher slope region of said at least one of said functions, are adjustable.

7. A temperature compensated crystal oscillator according to claim 1, wherein said function comprises a sigmoid function.

8. A temperature compensated crystal oscillator according to claim 7, wherein said sigmoid function comprises a Hyperbolic Tangent (Tanh) function.

9. A temperature compensated crystal oscillator according to claim 7, wherein said sigmoid function comprises an Arctangent (arctan) function.

10. An electronic apparatus comprising the temperature compensated crystal oscillator according to claim 1.

11. A temperature compensated crystal oscillator according to claim 1, wherein a horizontal position of the substantially higher slope region of said function, a slope value in the substantially higher slope region of said function, or a function value change magnitude over the substantially higher slope region of said function, is adjustable.

12. A temperature compensated crystal oscillator according to claim 1, wherein a horizontal position of the substantially higher slope region of said function, a slope value in the substantially higher slope region of said function, and a function value change magnitude over the substantially higher slope region of said function, are adjustable.

13. An integrated circuit suitable to construct a temperature compensated crystal oscillator the integrated circuit comprising:
   a primary temperature compensation signal generator arranged to produce a primary temperature compensation signal to effect a primary temperature compensation action over an entire temperature compensation temperature range of the temperature compensated crystal oscillator, which action is complementary, over said entire temperature compensation temperature range, to a frequency versus temperature characteristic of a crystal oscillator, to reduce a frequency versus temperature error of the crystal oscillator, leaving a residual frequency versus temperature error, and
   a secondary temperature compensation signal generator arranged to produce a secondary temperature compensation signal to effect a secondary temperature compensation action within said temperature compensation temperature range, which action is complementary to said residual frequency versus temperature error to reduce said residual frequency versus temperature error,
   wherein the temperature compensate crystal oscillator can be arranged to operate only under the primary temperature compensation action to facilitate characterisation of said residual frequency versus temperature error, and
   where the secondary temperature compensation signal generator comprises an analog circuit arranged to generate at least one analog temperature compensation signal as a function of an analog temperature sensor output signal, the said function
   comprising a plateau region, and a continuously and smoothly connected substantially higher slope region.

14. An integrated circuit according to claim 13, wherein the secondary temperature compensation signal comprises a combination of two or more analog signals generated by analog circuits as functions of an analog temperature sensor output signal, at least one of said functions
   comprising a plateau region, and a continuously and smoothly connected substantially higher slope region.

15. An integrated circuit according to claim 14, wherein two or more of said functions comprise a plateau region, and a continuously and smoothly connected substantially higher slope region.

16. An integrated circuit according to claim 15, wherein two or more of said functions comprise a sigmoid function.

17. An integrated circuit according to claim 13, wherein said function comprises a sigmoid function.

18. An integrated circuit according to claim 17, wherein said sigmoid function comprises a Hyperbolic Tangent (Tanh) function.

19. An integrated circuit according to claim 17, wherein said sigmoid function comprises an Arctangent (arctan) function.

20. A method of manufacturing a temperature compensated crystal oscillator which comprises a primary temperature compensation signal generator arranged to produce a primary temperature compensation signal to effect a primary temperature compensation action over an entire temperature compensation temperature range of the temperature compensated crystal oscillator, which action is complementary, over said entire temperature compensation temperature range, to a frequency versus temperature characteristic of the crystal oscillator, and a secondary temperature compensation signal generator arranged to produce a secondary temperature compensation signal to effect a secondary temperature compensation action within said temperature compensation temperature range, to reduce a residual frequency versus temperature error of the crystal oscillator left by said primary temperature compensation action, wherein the secondary temperature compensation signal generator comprises an analog circuit arranged to generate at least one analog temperature compensation signal as a function of an analog temperature sensor output signal, the said function comprising a plateau region, and a continuously and smoothly connected substantially higher slope region, which method comprises the steps of:
  (a) operating the temperature compensated crystal oscillator only under the primary temperature compensation action,
  (b) characterizing the residual frequency versus temperature error of the temperature compensated crystal oscillator operating only under said primary temperature compensation action; and
  (c) adjusting any one or more of a horizontal position of the substantially higher slope region, a slope value in the substantially higher slope region, and a function value change magnitude over the substantially higher slope region of said at least one analog temperature compensation signal to effect a secondary temperature compensation action complementary to said residual frequency versus temperature error characterised in step (b), to reduce said residual frequency versus temperature error.

21. A method according to claim 20 including adjusting all of a horizontal position of the substantially higher slope region, a slope value in the substantially higher slope region, and a function value change magnitude over the substantially higher slope region.

22. A temperature compensated crystal oscillator, comprising:
  a crystal oscillator,
  a primary temperature compensation signal generator arranged to produce a primary temperature compensation signal which effects a primary temperature compensation action over an entire temperature compensation temperature range of the temperature compensated crystal oscillator, which action is complementary, over said entire temperature compensation temperature range, to a frequency versus temperature characteristic of the crystal oscillator, to reduce a frequency versus temperature error of the crystal oscillator, leaving a residual frequency versus temperature error, and
  a secondary temperature compensation signal generator arranged to produce a secondary temperature compensation signal which effects a secondary temperature compensation action within said temperature compensation temperature range, which action is complementary to said residual frequency versus temperature error, to reduce said residual frequency versus temperature error,
  wherein the temperature compensated crystal oscillator can be arranged to operate only under the primary temperature compensation action to facilitate characterisation of said residual frequency versus temperature error, and
  wherein the secondary temperature compensation signal generator comprises an analog circuit arranged to generate at least one analog temperature compensation signal as a function of an analog temperature sensor output signal, the said function satisfying the following requirements:
  the function comprises a plateau region and a continuously and smoothly connected substantially higher slope region; and
  a horizontal position of the substantially higher slope region, a slope value in the substantially higher slope region, and a function value change magnitude over the substantially higher slope region are adjustable.

23. An auxiliary integrated circuit for use with a primary integrated circuit suitable to construct a temperature compensated crystal oscillator, the primary integrated circuit comprising a primary temperature compensation signal generator arranged to produce a primary temperature compensation signal to effect a primary temperature compensation action over an entire temperature compensation temperature range of the temperature compensated crystal oscillator, which action is complementary, over said entire temperature compensation temperature range, to a frequency versus temperature characteristic of a crystal oscillator, to reduce a frequency versus temperature error of the crystal oscillator, leaving a residual frequency versus temperature error, said auxiliary integrated circuit comprising a secondary temperature compensation signal generator arranged to produce a secondary temperature compensation signal to effect a secondary temperature compensation action within said temperature compensation temperature range, which action is complementary to said residual frequency versus temperature error to reduce said residual frequency error, wherein the temperature compensated crystal oscillator is operable only under the primary temperature compensation action to facilitate characterisation of said residual frequency versus temperature error and wherein the secondary temperature compensation signal generator comprises an analog circuit arranged to generate at least one analog temperature compensation signal as a function of an analog temperature sensor output signal, the said function comprising a plateau region, and a continuously and smoothly connected substantially higher slope region.

\* \* \* \* \*

UNITED STATES PATENT AND TRADEMARK OFFICE
CERTIFICATE OF CORRECTION

PATENT NO. : 10,790,831 B2  
APPLICATION NO. : 15/903178  
DATED : September 29, 2020  
INVENTOR(S) : Kevin Alan Neil Aylward Page 1 of 1

It is certified that error appears in the above-identified patent and that said Letters Patent is hereby corrected as shown below:

In the Claims

Column 9:
Line 16 (Claim 1, Line 9), after "oscillator" insert -- , --;
Line 46 (Claim 2, Line 5), after "signal" insert -- , --;
Line 47 (Claim 2, Line 6), after "functions" insert -- comprising a plateau --.

Column 10:
Line 28 (Claim 13, Line 2), after "oscillator" insert -- , --;
Line 50 (Claim 13, Line 23), after "temperature", "compensate" should read -- compensated --.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*